United States Patent
Leard

(10) Patent No.: US 7,538,335 B1
(45) Date of Patent: May 26, 2009

(54) SPECTRAL FILTER WITH DYE-IMPREGNATED RESONANT NANO-SPHERES

(75) Inventor: Francis Lawrence Leard, Sudbury, MA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 11/948,874

(22) Filed: Nov. 30, 2007

(51) Int. Cl.
*G01N 21/86* (2006.01)
*G01V 8/00* (2006.01)

(52) U.S. Cl. ............................................. 250/559.16
(58) Field of Classification Search ............. 250/559.16
See application file for complete search history.

(56) References Cited

U.S. PATENT DOCUMENTS

| | | | |
|---|---|---|---|
| 5,089,585 A | 2/1992 | Reynolds et al. | |
| 7,081,991 B2 | 7/2006 | Jones et al. | |
| 7,113,663 B1 * | 9/2006 | Spoonhower et al. | 385/16 |
| 2007/0099238 A1 | 5/2007 | Sigalas et al. | |

OTHER PUBLICATIONS

"Gold nanospheres and microspheres", http://www.microspheres-nanospheres.com/Microspheres/Inorganic/Metals/Gold.htm. (Observed Aug. 2, 2007), 1 pages.

"High Refraction Index Glass Microspheres", http://www.microspheres-nanospheres.com/Microspheres/Inorganic/Glass/high%20refraction%20index%20glass%20microspheres.htm, (Observed Aug. 2, 2007), 1 page.

"LED & Display Business Unit—Quantum Dots for Application Flexibility, Color Tunability, Improved Color Rendering", *evident technologies*, www.evidenttech.com/business-units/led-displays.php. (Observed Oct. 14, 2007), 5 pages.

"Microspheres—Nanospheres", http://www.microspheres-nanospheres.com/, (Observed Aug. 2, 2007), 2 pages.

"Nanotechnology Applied", *nanosys*, http://www.nanosysinc.com/app/index.html. (Observed Oct. 14, 2007), 2 pages.

"Optics", *LaserFocusWorld*, http://www.laserfocusworld.com/display_article/26842/12/none/News/OPTICS. (Observed Oct. 14, 2007), 2 pages.

"Quantum Dots—Versatile, Longer lasting Fluorescent Tags for Biology Research", *evident technologies—Life Sciences*, http://www.evidenttech.com/applications/quantum-dot-flupr-label.php, (Observed Oct. 14, 2007), 4 pages.

"Spectral Filtering", http://homepages.inf.ed.ac.uk/rbf/CVonline/LOCAL_COPIES/FISHER/specfilt.htm. (Observed Aug. 2, 2007), 3 pages.

(Continued)

*Primary Examiner*—Seung C Sohn
(74) *Attorney, Agent, or Firm*—Schwegman Lundberg Woessner; William R. Walbrun

(57) ABSTRACT

Embodiments of spectral filters with dye-impregnated nano-spheres are described herein. Other embodiments may be described and claimed. In some embodiments, a spectral filter comprises a host material that includes a plurality of nano-particles embedded within. The particles include a dye having an absorption band of wavelengths and have a size selected to resonate at a range of wavelengths that is within the absorption band. The particles may be selected to resonate in either a plasmon mode or a whispering-gallery mode.

25 Claims, 3 Drawing Sheets

OTHER PUBLICATIONS

"Spectral Filters", *Color Link*, http://www.colorlink.com/Page/fam_filters.htm, (Observed Aug. 2, 2007),1 page.

"Spectral traces for fluorescent dyes used in confocal / epifluorescence microscopy", http://www.mcb.arizona.edu/IPC/spectra_page.htm, (Observed Oct. 14, 2007),2 pages.

"The Leader in Quantum Dot Product Development", *evident technologies*, http://www.evidenttech.com, (Observed Oct. 14, 2007),3 pages.

Aslan, Kadir, et al., "Rapid Deposition of Triangular Silver Nanoplate on Planar Surfaces: Application to Metal-Enhanced Florescence", *J. Phys. Chem. B, vol. 109, NO. 13*, (2005), 6247-6251 Mar. 2005.

Fainman, Y., et al., "Nanophotonics for Optoelectronic System Integration", *Department of Electrical and Computer Engineering, University of California*, (2004),45-46 Oct. 2004.

Oubre, Chris, et al., "Optical Properties of Metallodielectric Nanostructures Caculated using the Finite Difference Time Domain Method", *J. Phys. Chem. B., vol. 108, No. 46*, (2004), 17740-17747 2004.

Quan, Haiyong, et al., "Simulation of Whispering-Gallery-Mode Resonace for Optical Miniature Biosensor", *Department of Mechanical and Aerospace Engineering Rutgers, The State University of New Jersey*, 10 pages 2004.

\* cited by examiner

SPECTRAL FILTER WITH DYE-IMPREGNATED RESONANT NANO-SPHERES

TECHNICAL FIELD

Some embodiments pertain to spectral filters. Some other embodiments pertain to near-infrared (NIR) filters. Some other embodiments pertain to sensors.

BACKGROUND

Spectral filters are many times used to remove the effects of spectral noise, such as ambient light or particular wavelengths. Some conventional spectral filters use an absorbent dye impregnated in a host material, however it is difficult to tailor the performance of these filters for specific wavelength ranges because the dyes have a broad absorption range. Furthermore, conventional spectral filters use a large amount of dye which in many cases is carcinogenic.

DETAILED DESCRIPTION

The following description and the drawings sufficiently illustrate specific embodiments to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in, or substituted for those of other embodiments. Embodiments set forth in the claims encompass all available equivalents of those claims.

Figure 1:
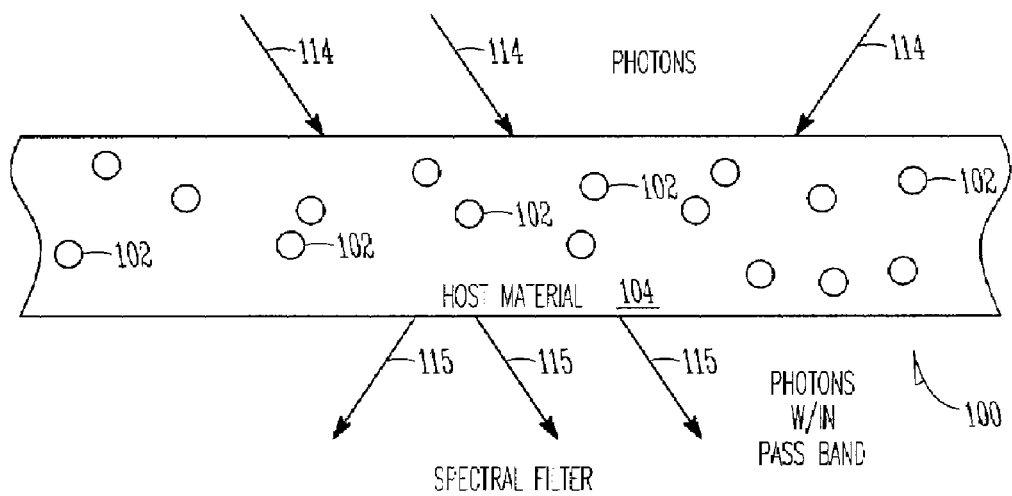
FIG. 1 illustrates a spectral filter in accordance with some embodiments.

FIG. 1 illustrates a spectral filter in accordance with some embodiments. Spectral filter 100 comprises host material 104 that includes a plurality of nano-particles 102 embedded within. Nano-particles 102 include a dye that has a selected absorption band of wavelengths. Nano-particles 102 may have a size selected to resonate at a range of wavelengths that is within the absorption band of the die. The use of nano-particles 102 selected to be of a certain size and the use of an absorbent dye within nano-particles 102 allows spectral filter 100 to be substantially angle independent. In other words, the filter characteristics (e.g., rejection-band, passband, and Q) are substantially independent of the angle at which photons 114 are incident on the surface of spectral filter 100. Furthermore, there is no need for multiple layers of filter material to achieve a high-Q, as in many conventional filters, because the combination of particle size (selected for resonance) and the particular absorption range of the dye may be selected achieve a high-Q passband and/or rejection-band filter. Output photons 115, for example, may have spectral characteristics within a passband of spectral filter 100.

In some embodiments, spectral filter 100 may be viewed as a dye-reduced filter. Many conventional spectral filters generally require the use significantly more dye because large areas of a substrate or host material are doped. Since many of these dyes are poisonous and/or carcinogenic, embodiments may help reduce the risks associated with the use of dyes since only small amounts of dye are used within nano-particles 102.

In some embodiments, nano-particles 102 may have a metallic coating and may operate in plasmon-mode resonance. In some other embodiments, nano-particles 102 may operate in whispering-gallery mode (WGM) resonance. These embodiments are discussed in more detail below.

Figure 2:
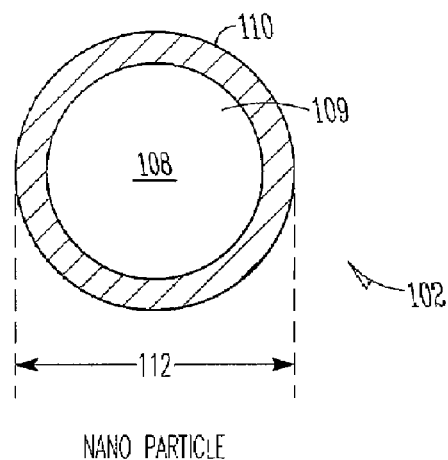
FIG. 2 illustrates a nano-particle in accordance with some embodiments.

FIG. 2 illustrates a nano-particle in accordance with some embodiments. Nano-particle 102 may include absorbent die 109, which may be impregnated within material 108. Nano-particle 102 may also include metallic coating 110. Metallic coating 110 is optional for WGM resonance embodiments. Material 108 may comprise a polymer or a glass material that may be doped or impregnated with die 109. Host material 104 may comprise a polymer, although glass materials may also be suitable. Nano-particle 102 is illustrated as having diameter 112.

Figure 3A:
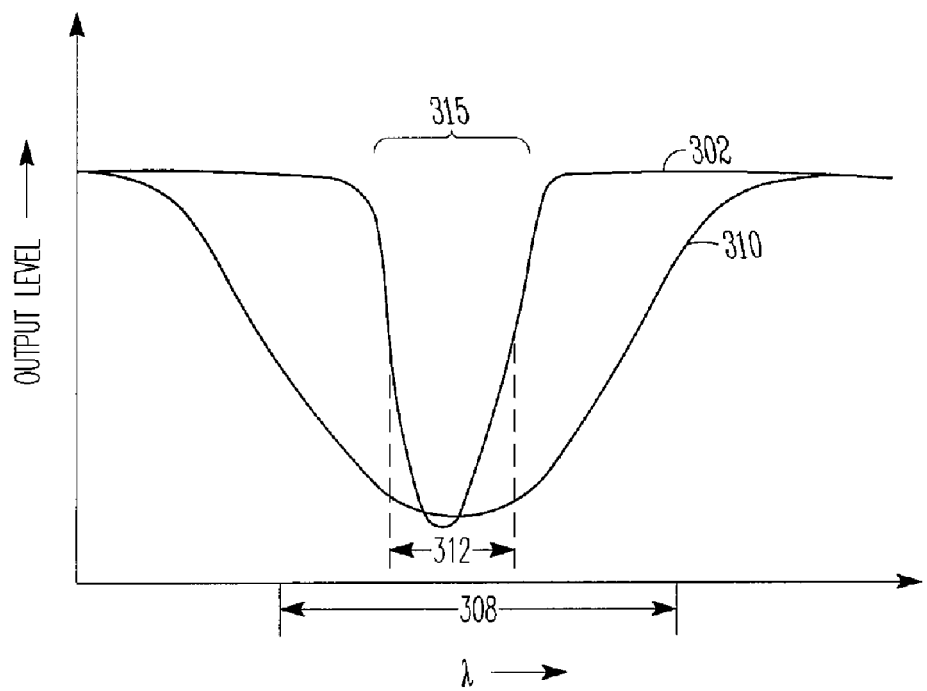
FIG. 3A illustrates a particle resonance spectrum and dye absorption band in accordance with some embodiments.

FIG. 3A illustrates a particle resonance spectrum and dye absorption band in accordance with some embodiments. Dye absorption level 310 represents the amount of energy absorption of a dye as a function of wavelength, and particle resonance spectrum 302 represents an amount of energy absorption due to particle resonance as a function of wavelength. Die 109 may absorb wavelengths with absorption band 308, and nano-particles 102 may resonate within resonance range 312. Resonance range 312 may be selected to be anywhere within absorption range 308 depending on the desired rejection-bands and passbands of filter 100. Rejection-band 315 includes wavelengths within resonance range 312 and absorption range 308. The passband may comprise wavelengths on either side of rejection band 315.

In accordance with embodiments, nano-particles 102 (FIG. 1) may have a size selected to resonate at range of wavelengths 312 that is within absorption band 308 of die 109. A high-Q rejection band, such as rejection band 315, may be selected, and/or one or more high-Q passbands on either side of band 315 may be provided by spectral filter 100 (FIG. 1). In some embodiments, discussed in more detail below, nano-particles 102 of different sizes may be used to provide more than one passband and/or more than one rejection band.

For plasmon-mode resonance embodiments, nano-particles 102 have metallic coating 110 selected to operate in plasmon-mode resonance. In these embodiments, diameter 112 of nano-particles 102 and a thickness of metallic coating 110 may be selected to provide a plasmon-mode resonance at wavelengths within absorption band 308 of dye 109 to result in a high-Q rejection-band of spectral filter 100. In these plasmon-mode resonance embodiments, metallic coating 110 may have a thickness ranging between 1 and 50 nanometers. In some embodiments, the thickness of metallic coating 110 may be on the order of one-tenth diameter 112. In these plasmon-mode resonance embodiments, a resonance may occur within metallic coating 110 and a resonance may also occur within material 108 beneath metallic coating 110.

In some plasmon-mode resonance embodiments, metallic coating 110 may be selected to allow photons 114 (e.g., of selected wavelengths) incident on spectral filter 100 to tunnel through metallic coating 110 and generate a plasmon mode field structure within metallic coating 110. Dye 109 may be selected to absorb photons within absorption band 308 while the photons remain within nano-particles 102. Photons 114, for example, may bounce around within the cavity of nano-particles 102. Photons that exit both the cavity and metallic coating 110 may comprise photons 115 that have spectral characteristics within a passband of filter 100. The photons that resonate and are absorbed may have spectral characteristics within a rejection band of spectral filter 100.

In plasmon-mode resonance embodiments, metallic coating 110 may comprise a metallic layer selected from the group consisting of silver, copper, or gold. In some embodiments, more than one metallic layer may be used. In some embodiments, the properties (e.g., thickness and type of material) of metallic coating 110 may be selected based on the layer's ability to retain the photons within nano-particles 102, resonate in a plasmon mode, and allow photons to tunnel through the coating for absorption. In some embodiments, a superconductive coating may be used.

In plasmon-mode resonance embodiments, diameter 112 may be selected to be resonant at one or more wavelengths within absorption band 308. The one or more wavelengths may be a fractional wavelength (e.g., approximately equal to a quarter-wavelength) of diameter 112 and may be based on an index of refraction of nano-particles 102 and a conductivity of metallic coating 110, although the scope of the disclosure is not limited in this respect. Diameter 112 of nano-particles 102 may be on the order of 150 nanometers, or less depending on the range 312 of wavelengths within resonance spectrum 302 selected for plasmon-mode resonance, although the scope of the disclosure is not limited in this respect as nano-particles 102 of greater size may also be used.

For WGM resonance embodiments, nano-particles 102 may have a circumference selected for resonance within absorption band 308 to provide a high-Q rejection-band 315 of spectral filter 100. In some WGM resonance embodiments, the circumference of nano-particles 102 may be selected so that the circumference divided by the optical length of the wavelengths may be equal an integral number of wavelengths. WGM resonance may occur when light travels in a dielectric medium of circular geometry. After repeated internal reflections at the curved boundary, the electromagnetic field closes on itself, giving rise to resonances. In some WGM resonance embodiments, nano-particles 102 may be substantially spherical.

In WGM resonance embodiments, nano-particles 102 may be devoid of a metallic or a conductive coating. In these whispering-mode resonance embodiments, a metallic coating is optional.

Alternatively, in WGM resonance embodiments, nano-particles 102 may comprise a very thin metallic coating disposed thereon. This thin metallic coating may be much thinner than metallic 110 coating used in the plasmon-mode resonance embodiments discussed above. A thin metallic coating for WGM resonance may help increase the Q of spectral filter 100. In some of these WGM resonance embodiments, the thin metallic coating may have a thickness of less than 10 nanometers and may be selected to be sufficiently thin to inhibit plasmon-mode resonance.

In WGM resonance embodiments, the circumference of nano-particles 102 may be selected so that WGM resonance occurs at one or more wavelengths within absorption band 308. The one or more wavelengths may be approximately equal to a fractional wavelength (e.g., a portion of a wavelength, not necessarily a quarter-wavelength) of the circumference and based on an index of refraction of nano-particles 102 and a conductivity of the thin metallic coating, if used, although the scope of the disclosure is not limited in this respect.

In some WGM resonance embodiments, the thin metallic coating may comprise a multi-layer coating comprising two or more layers of metal. Almost any type of metal may be used. The use of two or more layers for the thin metallic coating may help increase the Q of spectral filter 100. In some alternate embodiments, the thin metallic coating may comprise a semiconductor coating. In some alternate embodiments, rather than a metallic or semiconductive coating, a coating with a complex permittivity may be selected, although the scope of the disclosure is not limited in this respect.

In both plasmon-mode resonance embodiments and WGM embodiments, the size of nano-particles 102 and absorptive dye 109 may be selected so that resonance range 312 and absorption band 308 may comprise near-infrared (NIR) wavelengths. Dye 109 may be an organic dye selected to absorb photons 114 having NIR wavelengths. Some examples of organic dyes may include anthraquinone, quinoneimine, azomethine, polymethine, indamine, indophenol, formazan, and pyrazolazole dyes, although the scope of the disclosure is not limited in this respect. In some alternate embodiments, inorganic dyes may be used.

In some other embodiments, the size of nano-particles 102 and dye 109 may be selected so that resonance range 312 and absorption band 308 comprise ultraviolet wavelengths. In some other embodiments, the size of nano-particles 102 and dye 109 may be selected so that resonance range 312 and absorption band 308 comprise visible wavelengths.

The quantity of nano-particles 102 dispersed within host material 104 may have little effect on the selected resonance range and the Q of spectral filter 100, however the density of nano-particles 102 may affect the absorptive properties of the filter. In accordance with embodiments, nano-particles 102 may have a pseudo-random distribution with host material 104. Unlike many conventional resonant structures, the spacing between nano-particles 102 is not selected to provide any type of resonance and is not critical to embodiments.

In some alternate embodiments, nano-particles 102 may comprise a liquid dye encased within a shell (e.g., the shells may be filled with liquid dye). The shells may comprise a conductive material, such as metallic coating 110 or carbon nanotubes, for plasmon-mode resonance embodiments, or the shells may comprise plastic or glass materials for some WGM resonance embodiments.

In multi-resonance embodiments, spectral filter 100 may include nano-particles 102 selected to have two or more resonances within absorption band 308 of die 109. An example of this is illustrated in FIG. 3B.

Figure 3B:
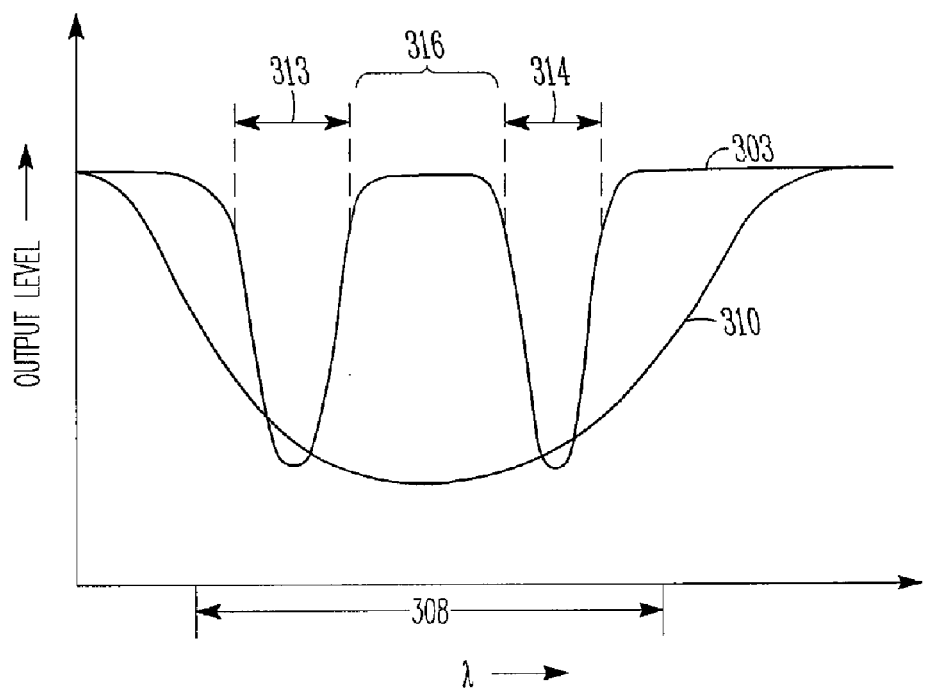
FIG. 3B illustrates a particle resonance spectrum and dye absorption band in accordance with some multi-resonant embodiments.

FIG. 3B illustrates a particle resonance spectrum and dye absorption band in accordance with some multi-resonant embodiments. In these embodiments, nano-particles 102 of two or more sizes are selected to resonate at different ranges of wavelengths. In an example embodiment, nano-particles 102 may comprise first and second sets of nano-particles. The first set may have a size selected to resonate at range of wavelengths 313 within absorption band 308. The second set may have a size selected to resonate at range of wavelengths 314 within absorption band 308. Wavelengths within the first and second ranges are rejected by the filter and a high-Q passband 316 may be provided therebetween.

Accordingly, as illustrated in the example embodiments of FIGS. 3A and 3B, spectral filter 100 may be either configured as a single rejection band filter or configured with two or more rejection bands with one or more passbands in-between depending on the selection of nano-particles 102 to provide one or more resonant wavelength ranges.

Figure 4:
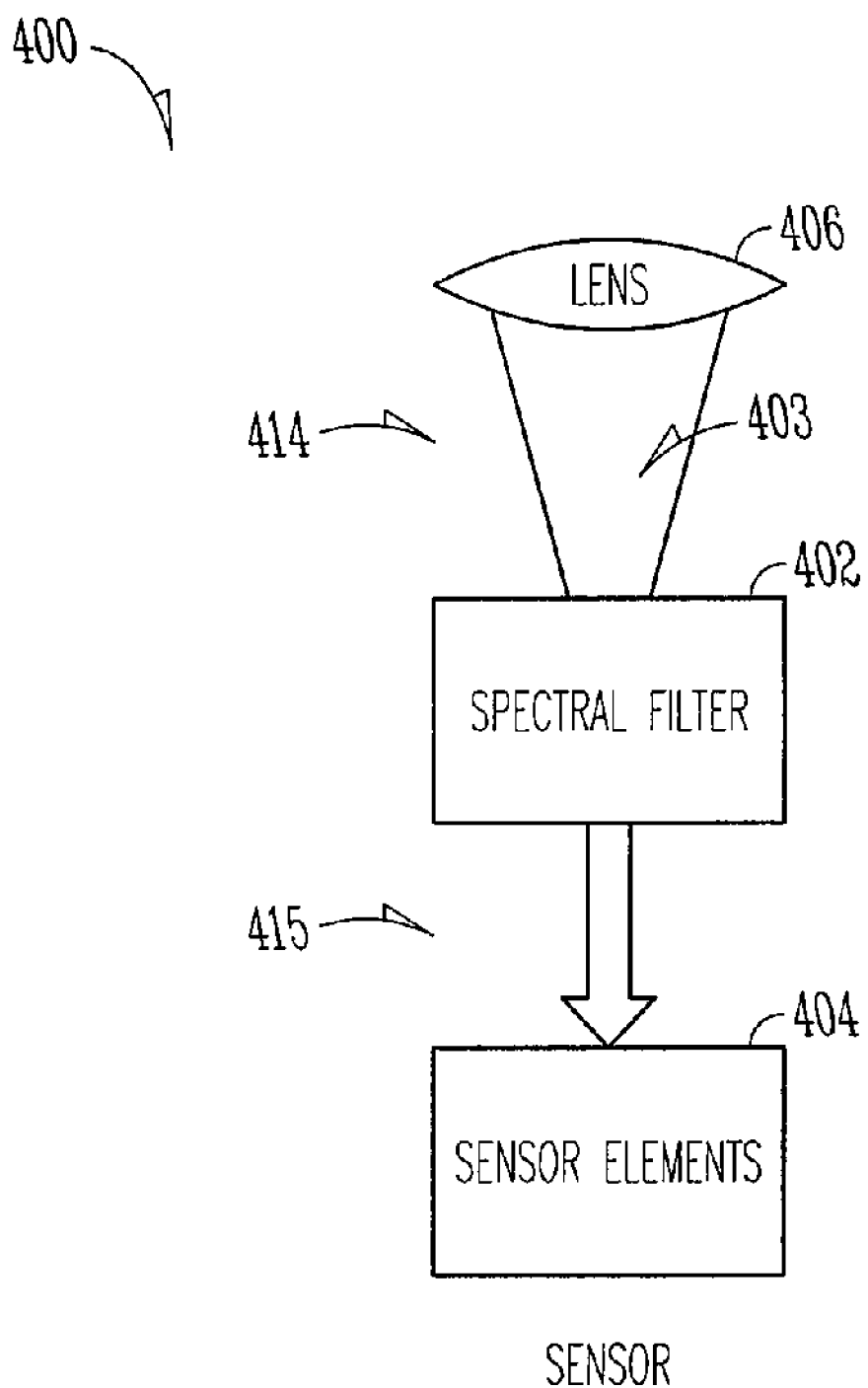
FIG. 4 illustrates a sensor in accordance with some embodiments.

FIG. 4 illustrates a sensor in accordance with some embodiments. Sensor 400 may include lens 406 and spectral filter 402 that may be provided at or near a focal point of lens 406. Sensor 400 may also include sensor elements 404 responsive to wavelengths provided by spectral filter 402. Spectral filter 100 (FIG. 1) may be suitable for use as spectral filter 402 and may operate in either plasmon-mode resonance or WGM resonance. As illustrated in FIG. 4, wavelengths pass through lens 406 and are provided to spectral filter 402 over a range of angles 403 when filter 402 is positioned at or near the focal point of lens 406. When spectral filter 402 is a rejection-band filter, the signal-to-noise (SNR) of sensor 400 may be increased by reducing and/or eliminating undesired wavelengths, such as those of ambient light. When spectral filter 400 is a NIR filter, the effects of UV, non-NIR and visible wavelengths may be reduced and/or eliminated. Because the operation of spectral filter 400 is substantially angle independent, filter 400 may be positioned at or near the focal point of lens 406 which provides wavelengths to filter 400 over a range of angles 403. The positioning of filter 400 at or near the focal point allows filter 400 to be much smaller in size and less costly than many conventional spectral filters because many conventional spectral filters are sensitive to the angle from which wavelengths are received. A reduced size is particularly beneficial, for example, in airborne platforms, such as missiles and aircraft. In some embodiments, sensor 400 may be a proximity sensor, although the scope of the disclosure is not limited in this respect.

In some example embodiments, the characteristics of spectral filter (e.g., rejection-band, passband, and Q) are substantially independent of the angle at which photons 414 are incident on the surface of spectral filter 402. Output photons 415, for example, may have spectral characteristics within the filter's passband.

In some embodiments, filter 402 may be a rejection-band NIR filter configured to remove NIR wavelengths with a rejection band emitted by a light-emitting diode (LED) source. The size of nano-particles 102 and dye 109 may be selected so that the absorption band and the resonance range comprise NIR wavelengths. The size of nano-particles 102 and dye 109 may alternatively be selected so that the absorption band and the resonance range comprise visible wavelengths. The size of nano-particles 102 and dye 109 may alternatively selected so that the absorption band and the resonance range comprise ultraviolet wavelengths.

Lens 406 may be an optical lens comprising glass, a polymer, or a combination thereof. Lens 406 may be refractive, diffractive or a combination thereof. Lens may alternatively be a hyperlens comprising a material having a negative index-of-refraction to magnify sub-wavelength features that are above a diffraction limit of the lens. In some embodiments, the hyperlens may include a metallic structure therein.

In some embodiments, sensor 400 may be part of a sensor network. In these embodiments, the sensor network may comprise a plurality of sensors. Each sensor may be configured to be responsive to wavelengths within an associated passband. Each sensor may comprise a lens, such as lens 406, and a spectral filter, such as spectral filter 402, positioned at or near a focal point of the lens to pass wavelengths within the sensor's associated passband and substantially remove wavelengths associated with other sensors of the plurality. In these sensor network embodiments, the nano-particles of each spectral filter may have sizes selected to resonate at wavelengths within passbands of other sensors of the plurality. The wavelengths within passbands of the spectral filters of the sensors are selected to be substantially non-interfering with each other. Accordingly, spatial-positioning of the sensors to avoid interference from other sensors is not necessary.

In some optical-tag embodiments, an optical tag may include a spectral filter, such as spectral filter 100 (FIG. 1), configured to have a plurality of rejection-bands to provide a predetermined spectrum response. The plurality of rejection bands may uniquely identify the tag. The plurality of rejection bands may be within the absorption band of a dye and each rejection band may be provided by particles have an associated resonance.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A passive spectral filter comprising:
    a host material that includes a plurality of nano-particles embedded within, the nano-particles having a pseudo-random distribution within the host material,
    wherein the particles include a dye therein having an absorption band of wavelengths,
    wherein the particles have a size selected to resonate at a range of wavelengths that is within the absorption band of the die,
    wherein the passive spectral filter provides a rejection band comprising the range of wavelengths at which the particles resonate, and
    wherein photons incident on the host material having spectral components within the rejection band are inhibited from passing through the host material.

2. The filter of claim 1 wherein the particles comprise first and second sets of nano-particles, the first set having a first size selected to resonate at a first range of wavelengths within the absorption band of the dye, and
    the second set having a second size selected to resonate at a second range of wavelengths within the absorption band of the dye,
    wherein wavelengths within the first and second ranges are rejected by the filter and a passband is provided therebetween.

3. The filter of claim 1 wherein the particles have a metallic coating and operate in plasmon-mode resonance due to the metallic coating, and
    wherein a diameter of the particles and a thickness of the metallic coating are selected to provide a resonance within the absorption band of the dye to result in the rejection band of the filter.

4. The filter of claim 3 wherein the metallic coating is selected to allow photons incident on the filter to tunnel through the metallic coating and generate a plasmon mode field structure within the metallic coating, and
    wherein the dye is selected to absorb photons within the absorption band while the photons remain within the particles.

5. The filter of claim 4 wherein the metallic coating comprises a metallic layer selected from the group consisting of silver, copper, or gold.

6. The filter of claim 3 wherein a diameter of the particles is selected to be resonant at one or more wavelengths within the absorption band, the one or more wavelengths being a fractional wavelength of the diameter and based on a index of refraction of the particles and a conductivity of the metallic coating.

7. The filter of claim 1 wherein the particles comprise nano-particles and have a circumference selected for whispering-gallery mode (WGM) resonance within the absorption band to provide the rejection band of the filter.

8. The filter of claim 7 wherein the particles are substantially spherical and are devoid of metallic or conductive coating.

9. The filter of claim 7 wherein the particles are substantially spherical and comprise a metallic coating disposed thereon.

10. The filter of claim 9 wherein the circumference of the particles is selected to be resonant at one or more wavelengths within the absorption band, the one or more wavelengths being approximately equal to a fractional wavelength of the circumference and based on a index of refraction of the particles and a conductivity of the metallic coating.

11. The filter of claim 1 wherein the size of particles and the dye are selected so that the resonance range and the absorption band comprise near-infrared (NIR) wavelengths.

12. The filter of claim 1 wherein the size of particles and the dye are selected so that the resonance range and the absorption band comprise ultraviolet wavelengths.

13. The filter of claim 1 wherein the size of particles and the dye are selected so that the resonance range and the absorption band comprise visible wavelengths.

14. A sensor comprising:
a lens;
a passive spectral filter provided at or near a focal point of the lens to filter a predetermined range of wavelengths;
sensor elements responsive to wavelengths provided by the spectral filter,
wherein the passive spectral filter comprises a host material that includes a plurality of nano-particles embedded within, the nano-particles having a pseudo-random distribution within the host material,
wherein the particles include a dye therein having an absorption band of wavelengths,
wherein the particles have a size selected to resonate at a range of wavelengths that is within the absorption band of the die,
wherein the passive spectral filter provides a rejection band comprising the range of wavelengths at which the particles resonate, and
wherein photons incident on the host material having spectral components within the rejection band are inhibited from passing through the host material.

15. The sensor of claim 14 wherein the host material is a polymer,
wherein the particles comprise glass with a metallic coating, and
wherein a thickness of the metallic coating is selected to provide either a plasmon-mode resonance or a whispering-gallery mode resonance within the particles,
wherein the metallic coating is selected to be thicker to provide plasmon-mode resonance and is selected to be thinner to provide whispering-gallery mode resonance.

16. The sensor of claim 15 wherein the filter is a rejection-band near-infrared (NIR) filter configured to remove NIR wavelengths with a rejection band emitted by a light-emitting diode (LED) source, and
wherein the size of particles and the dye are selected so that the absorption band and the resonance range comprise NIR wavelengths.

17. The sensor of claim 15 wherein the size of particles and the dye are selected so that the absorption band and the resonance range comprise visible wavelengths.

18. The sensor of claim 15 wherein the size of particles and the dye are selected so that the absorption band and the resonance range comprise ultraviolet wavelengths.

19. The sensor of claim 15 wherein the lens is an optical lens comprising glass, a polymer, or a combination thereof.

20. The sensor of claim 15 wherein the lens is a hyperlens comprising a material having a negative index-of-refraction to magnify sub-wavelength features that are above a diffraction limit of the lens.

21. The sensor of claim 15 wherein the lens comprises a refractive lens, a diffractive lens, or a combination of one or more refractive and diffractive lenses.

22. A passive spectral filter comprising:
a polymer host material having a pseudo-random distribution of substantially-spherical nano-particles embedded therein,
wherein the nano-particles include a dye having an absorption band of near-infrared (NIR) wavelengths, and
wherein the particles comprise glass with a metallic coating and have a size selected to be resonant at a range of wavelengths within the absorption band of the die to provide a NIR rejection band, and
wherein photons incident on the host material having spectral components within the NIR rejection band are inhibited from passing through the host material.

23. The spectral filter of claim 22 wherein a thickness of the metallic coating is selected to provide either a plasmon-mode resonance or a whispering-gallery mode resonance within the particles,
wherein the metallic coating is selected to be thicker to provide plasmon-mode resonance and is selected to be thinner to provide whispering-gallery mode resonance.

24. The spectral filter of claim 23, wherein for plasmon-mode resonance, a diameter of the nano-particles is selected to be a fractional wavelength of a wavelength within the NIR rejection band selected for resonance, and
wherein for whispering-gallery mode resonance, a circumference of the nano-particles is selected to be a fractional wavelength of the wavelength within the NIR rejection band selected for resonance.

25. A sensor network comprising a plurality of sensors each configured to be responsive to wavelengths within an associated passband, wherein each sensor comprises:
a lens; and
a passive spectral filter positioned at or near a focal point of the lens to pass wavelengths within the sensor's associated passband and substantially remove wavelengths associated with other sensors of the plurality,
wherein the passive spectral filter of each sensor comprises: a host material that includes a plurality of nano-particles embedded within, the nano-particles having a pseudo-random distribution within the host material,
wherein the particles include a dye therein having an absorption band of wavelengths,
wherein the particles have a size selected to resonate at a range of wavelengths that is within the absorption band of the die,
wherein the nano-particles of each spectral filter have sizes selected to resonate at wavelengths within passbands of other sensors of the plurality, and
wherein wavelengths within passbands of the spectral filters of the sensors are selected to be substantially non-interfering with each other.

* * * * *